(12) United States Patent
Hsu

(10) Patent No.: US 6,967,844 B2
(45) Date of Patent: *Nov. 22, 2005

(54) CERAMIC HEAT SINK WITH MICRO-PORES STRUCTURE

(75) Inventor: Chaby Hsu, Taoyuan Hsien (TW)

(73) Assignee: ABC Taiwan Electronics Corp., Taoyuan Hsien (TW)

(*) Notice: Subject to any disclaimer, the term of this patent is extended or adjusted under 35 U.S.C. 154(b) by 249 days.

This patent is subject to a terminal disclaimer.

(21) Appl. No.: 10/652,823

(22) Filed: Aug. 29, 2003

(65) Prior Publication Data

US 2005/0047089 A1    Mar. 3, 2005

(51) Int. Cl.[7] .............................................. H05K 7/20
(52) U.S. Cl. ..................... 361/704; 361/708; 361/709; 165/185
(58) Field of Search ................... 361/704, 706–708; 165/80.3, 185; 257/706, 722; 174/16.3

(56) References Cited

U.S. PATENT DOCUMENTS 6,529,379 B1 * 3/2003 Fuller et al. ................. 361/705

FOREIGN PATENT DOCUMENTS

| JP | 02113561 A | * | 4/1990 | ........... H01L 23/36 |
| JP | 03036754 A | * | 2/1991 | ......... H01L 23/373 |

* cited by examiner

*Primary Examiner*—Boris Chervinsky
(74) *Attorney, Agent, or Firm*—Alan D. Kamrath; Nikolai & Mersereau, P.A.

(57) ABSTRACT

A ceramic heat sink having a micro-pores structure includes a thermal conductive layer mounted on a surface of a heat source to absorb heat from the heat source, a heat dissipation layer combined with the thermal conductive layer and having a micro-pores structure with hollow crystals to provide a relatively greater surface area, and a cooling fan mounted on the heat dissipation layer to provide a forced convection effect. Thus, the micro-pores structure can increase the contact surface area between the heat sink and the air, thereby enhancing the heat dissipation effect of the ceramic heat sink.

6 Claims, 12 Drawing Sheets

| Increasing temperature | 1 | 2 | 3 | 4 | 5 | 6 | 7 | 8 |
|---|---|---|---|---|---|---|---|---|
| temperature °C | 150 | 250 | 250 | 550 | 550 | 800 | 1040 | 1040 |
| time mins | 30 | 60 | 120 | 90 | 120 | 120 | 120 | 180 |

| Time (hr). | Diameter (um) | Viscosity (cps) 12rpm | BYK-111 |
|---|---|---|---|
| 5 | 0.491 | 53.5 | 1.2% |
| 7.5 | 0.189 | 26.6 | 1.2% |
| 10 | 0.132 | 10 | 2.0% |
| 12.5 | 0.125 | 8.6 | 2.0% |
| 17.5 | 0.09 | 7.9 | 2.0% |

|  | Copper | Copper | Aluminum | Aluminum | Fin shape Aluminum heat sink |
|---|---|---|---|---|---|
| Thickness of metal ( mm ) | 2.0 | 3.0 | 3.0 | 4.0 | |
| Thickness of MPC ( mm ) | 1.8 | 1.8 | 1.8 | 1.8 | |
| Total thickness ( mm ) | 3.8 | 4.8 | 4.8 | 5.8 | At least 40 |
| Weight of metal ( g ) | 86 | 132 | 39 | 52.5 | |
| Weight of MPC ( g ) | 16.7 | 16.7 | 17.3 | 17.1 | |
| Weight of Epoxy ( g ) | 1.3 | 1.3 | 1.3 | 1.3 | |
| Total Weight ( g ) | 104 | 150 | 57.6 | 70.9 | At least 300 |
| Total materials cost ( NTD ) | 8.97 | 13.48 | 3.95 | 5.12 | 26.1 |
| Cost down percentage ( % ) | 65.6% | 48.4% | 84.8% | 80.3% | Compare to original |

Fig.16

CERAMIC HEAT SINK WITH MICRO-PORES STRUCTURE

BACKGROUND OF THE INVENTION

1. Field of the Invention

The present invention relates to a ceramic heat sink having a micro-pores structure, and more particularly to a ceramic heat sink having a micro-pores structure that can increase the contact surface area between the heat sink and the air, thereby enhancing the heat dissipation effect of the ceramic heat sink.

2. Description of the Related Art

The CPU (central processing unit) of the computer is operated at a high speed, and easily produces a high temperature. The conventional heat sink is mounted on the CPU of the computer to carry away the heat produced from the CPU of the computer.

The conventional heat sink in accordance with the prior art shown in FIG. 17 comprises a heat conducting layer F bonded on the surface of the CPU "B", a heatsink plate A mounted on the heat conducting layer F and having a plurality of heat dissipation fins C to increase the heat dissipation effect, a cooling fan D mounted on the heatsink plate A for carrying the heat produced by the CPU "B", and a plurality of spacers E mounted between the cooling fan D and the heat dissipation fins C of the heatsink plate A.

However, the contact area between the conventional heat sink and the CPU "B" is not large enough, thereby limiting and decreasing the heat dissipation effect of the conventional heat sink.

SUMMARY OF THE INVENTION

The primary objective of the present invention is to provide a ceramic heat sink having a micro-pores structure that can increase the contact surface area between the heat sink and the air, thereby enhancing the heat dissipation effect of the ceramic heat sink.

In accordance with the present invention, there is provided a ceramic heat sink having a micro-pores structure, comprising a ceramic heat sink having a micro-pores structure, comprising:

at least one thermal conductive layer mounted on a surface of a heat source to absorb heat from the heat source;

a heat dissipation layer combined with the thermal conductive layer and having a micro-pores structure with hollow crystals to provide a relatively greater surface area; and a cooling fan mounted on the heat dissipation layer to provide a forced convection effect.

Further benefits and advantages of the present invention will become apparent after a careful reading of the detailed description with appropriate reference to the accompanying drawings.

BRIEF DESCRIPTION OF THE DRAWINGS

FIG. 16 is a calculation table of the size and cost of the heat sink in accordance with the present invention.

DETAILED DESCRIPTION OF THE INVENTION

The applied principle of the present invention is described as follows.

First of all, the liquid-liquid phase transformation of the microscopic chemistry is described as follows.

Figure 1:
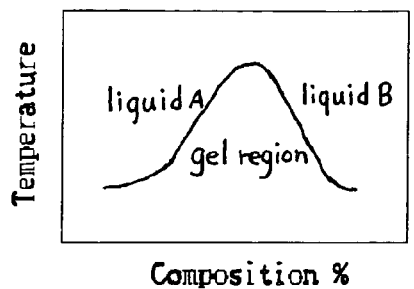
FIG. 1 is a graph of a liquid-liquid phase transformation in accordance with the present invention.
Figures 2, 2A:
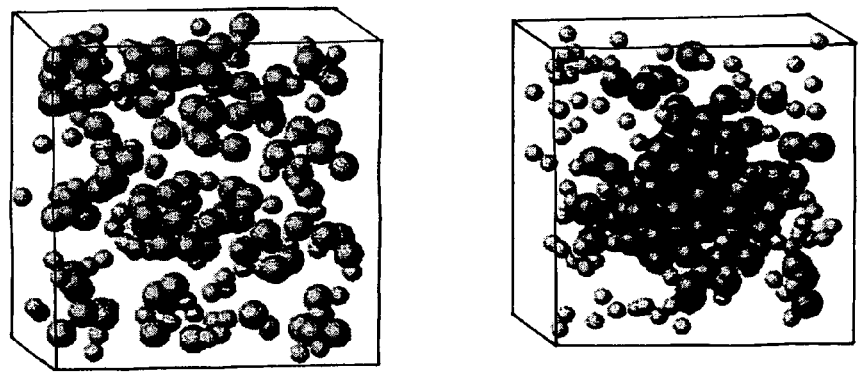
FIG. 2 is a schematic view of particle dispersant simulation in accordance with the present invention.
FIG. 2A is a schematic view showing the particle emulsion polymerization in accordance with the present invention.

The present invention uses two organic solvents (toluene and alcohol) contained in the organic slurry to mix with the hydrophilic high molecular binder, thereby forming a mixture. In such a manner, the alcohol is fully mixed with the water (hydrophilic), and the toluene functional radical are repellent with the water (hydrophobic). Thus, the toluene is not dissolved with the hydrophilic functional radical, so that the mixture can be stirred to form a gel-shaped slurry. As shown in FIG. 1, the gel region is shown. Thus, the ceramic is bonded with the gel. As shown in FIGS. 2 and 2A, in the gel, the particles having a larger diameter are gathered together immediately by the Van der Waal's forces, and the particles having a smaller diameter are filled in the periphery of the group of the particles having a larger diameter. At the same time, the high molecular binder and the inorganic material form a steady-state covalent bond. FIG. 2 shows an even dispersion, and FIG. 2A shows an uneven dispersion produced after the gel is made. Thus, after the ceramic is sintered, the natural and even space is formed, thereby forming a micro-pores structure.

Secondly, the physical principle is described as follows.

The nanometer powder material has features different from that of the common material, such as the optical effect, magnetism effect, thermal conduction effect, thermal diffusion effect and other mechanical features. Thus, the ceramic powders of different diameters can be mixed to achieve the features of the nanometer material.

The present invention adopts the powder having a smaller diameter (sub-micrometer grade, such as 0.13 $\mu$m), and the powder is sintered to form the ceramic having a micro-pore structure so as to obtain the optimum heat dissipation effect. In addition, it is necessary to control the increasing temperature conditions during the sintering process, so as to obtain the optimum porosity and mechanical strength. In general, when the powder diameter is increased, the porosity after sintering is increased, and the mechanical strength of the material is relatively decreased greatly.

Thirdly, the physical thermal transmission principle is described as follows.

Figure 3:
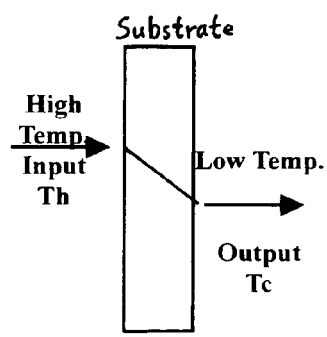
FIG. 3 is a schematic view showing the thermal conduction principle.

The heat transfer effect includes the thermal conduction, thermal convection and radiation. In general, the energy that the radiation can carry is too small, so that the radiation effect is not considered. Thus, in fabrication of the heat sink, only the heat transfer effects of the thermal conduction and thermal convection are taken into account. As shown in FIG. 3, in the heat sink device of the computer, the heat energy is transmitted to the surface of the object by the thermal conduction effect. Then, the heat energy is carried away by the media, such as the air, due to the thermal convection effect, so as to decrease the temperature of the object. Thus, by the thermal convection effect, the heat produced by the chips of the CPU of the computer can be carried away by the air.

The formula of the thermal conduction effect is listed as follows.

$Q = K \times A \times \Delta T / \Delta X$, wherein Q is the energy, K is the thermal conduction coefficient, A is the area of the substrate, $\Delta T$ is the temperature difference, and $\Delta X$ is the thickness of the substrate.

The formula of the thermal convection effect is listed as follows.

$Q = h \times A \times \Delta T$, wherein Q is the energy carried by the thermal convection effect, h is the thermal convection coefficient, A is the area of the substrate, and $\Delta T$ is the temperature difference.

The method for manufacturing the material of the micro-pores structure in accordance with the present invention comprises the following steps.

First of all, in preparation of a slurry, a ceramic material (including $TiO_2$, BaO, SrO, $Al_2O_3$ and $Zr_2O$) of a proper proportion is prepared, two organic solvents (including the alcohol (ethyl alcohol) and the toluene) are prepared, and a dispersant (the viscosity is about 5 to 10 cps) is prepared. Then, the ceramic material is mixed with the two organic solvents and the dispersant, thereby forming an even dispersion state. Then, the mixture is mortared and stirred by multiple mill balls (such as $Zr_2O$ mill balls, $Al_2O_3$ mill balls or the like), thereby forming a sub-micrometer powder slurry.

Subsequently, in preparation of a binder, the polyvinyl alcohol (PVA) and water of a proper proportion are stirred evenly to form the binder.

Subsequently, the sub-micrometer powder slurry is mixed with the binder to form a mixture which is stirred violently and severely, thereby forming an emulsion gel.

Finally, the emulsion gel is dried into a solid, thereby forming the micro-pores structure of the present invention.

The method for manufacturing the ceramic heat sink having the micro-pores structure in accordance with the present invention comprises the following steps.

First of all, the palletizing process is performed. The above-mentioned micro-pores structure is finely mortared in the mortar, then placed in a special fixture, and then punched to form a heat dissipation layer having a predetermined shape.

Subsequently, the sintering process is performed. The heat dissipation layer having a predetermined shape is sintered to form a natural and even space, thereby forming the heat dissipation layer having a micro-pores structure with hollow crystals.

Finally, the thermal conductive layer is performed by a printing process. The thermal conductive layer is printed on the heat dissipation layer in an epoxy-bonding manner, thereby forming the ceramic heat sink having the micro-pores structure.

Figure 6:
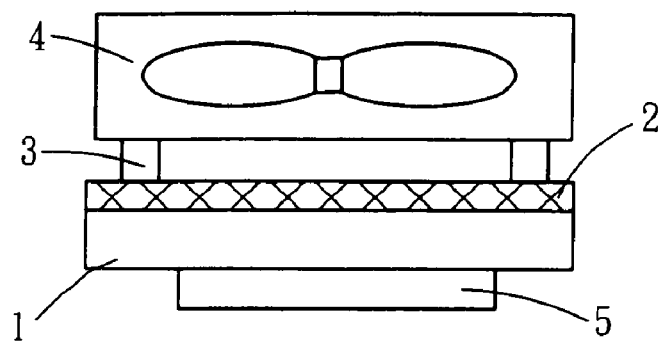
FIG. 6 is a plan cross-sectional assembly view of the ceramic heat sink in accordance with the preferred embodiment of the present invention.

Referring to FIG. 6, the ceramic heat sink having the micro-pores structure in accordance with the preferred embodiment of the present invention comprises a thermal conductive layer 1 bonded on the surface of the CPU (central processing unit) 5 of the computer, a heat dissipation layer 2 combined with the thermal conductive layer 1, a cooling fan 4 mounted on heat dissipation layer 2 for carrying the heat produced by the CPU 5, and a plurality of spacers 3 mounted between the cooling fan 4 and the heat dissipation layer 2.

The heat dissipation layer 2 uses the principle of the liquid-liquid phase transformation of the microscopic chemistry to form a ceramic micro-cell structure by the uneven dispersion of the gel-shaped slurry. The ceramic micro-cell structure is combined with a sub-micrometer powder, and is then sintered, thereby forming the heat dissipation layer 2 having a micro-pores structure with hollow crystals. In such a manner, the heat dissipation layer 2 has a greater mechanical strength. Alternatively, the ceramic worked by the biscuit firing process can function as the heat dissipation layer 2 which has a smaller mechanical strength. Preferably, the heat dissipation layer has a powder diameter about 0.09 to 0.30 $\mu$m, and has a porosity about 5% to 40%.

The thermal conductive layer 1 contacts with the heat source (the CPU 5), so as to absorb the heat produced from the heat source. Thus, the heat conductive layer 1 absorbs the heat from the heat source, the heat dissipation layer 2 has a micro-pores structure with hollow crystals, the air functions as the medium of heat dissipation, and the cooling fan 4 provides a forced convection effect, so that the heat dissipation capacity of the ceramic heat sink in accordance with the preferred embodiment of the present invention is greatly enhanced. Preferably, the thermal conductive layer 1 is made of a copper plate whose heat conduction coefficient K is equal to 380 W/mK. In addition, the thermal conductive layer 1 can be made of the silver (Ag) having a greater heat conduction coefficient, so as to enhance the heat dissipation capacity.

Figure 7:
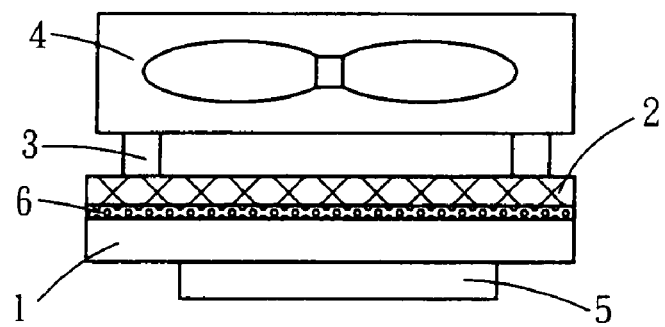
FIG. 7 is a plan cross-sectional assembly view of the ceramic heat sink in accordance with another embodiment of the present invention.

Referring to FIG. 7, the ceramic heat sink having the micro-pores structure in accordance with another embodiment of the present invention comprises an epoxy layer 6 sandwiched between the thermal conductive layer 1 and the heat dissipation layer 2.

Figure 8:
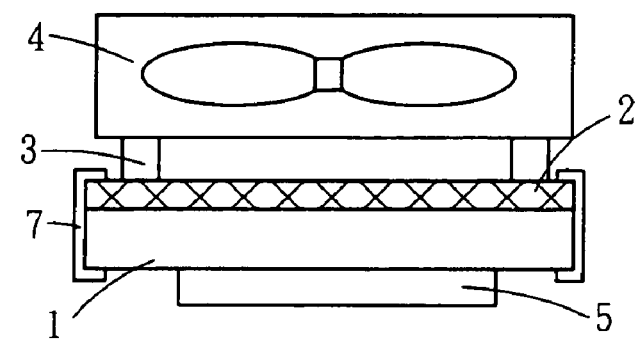
FIG. 8 is a plan cross-sectional assembly view of the ceramic heat sink in accordance with another embodiment of the present invention.

Referring to FIG. 8, the ceramic heat sink having the micro-pores structure in accordance with another embodiment of the present invention comprises a snapping tool 7 for combining the thermal conductive layer 1 with the heat dissipation layer 2.

Figure 9:
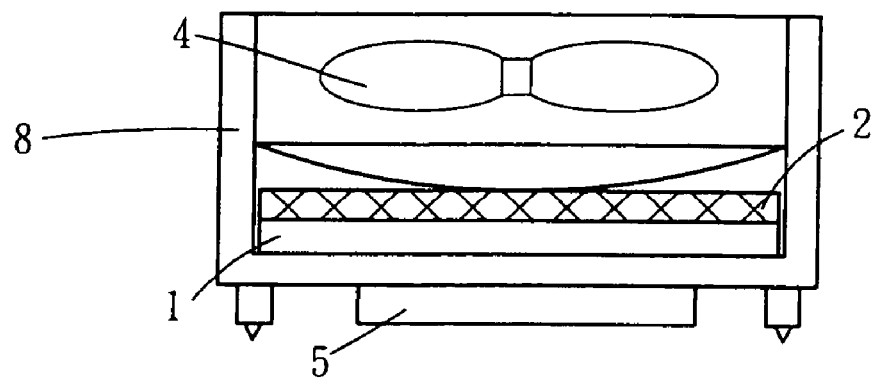
FIG. 9 is a plan cross-sectional assembly view of the ceramic heat sink in accordance with another embodiment of the present invention.

Referring to FIG. 9, the ceramic heat sink having the micro-pores structure in accordance with another embodiment of the present invention comprises a snapping tool 7 for snapping the cooling fan 4 and for combining the thermal conductive layer 1 with the heat dissipation layer 2.

The example of the method for manufacturing the ceramic heat sink having the micro-pores structure in accordance with the present invention is illustrated as follows.

Figures 5, 5A:
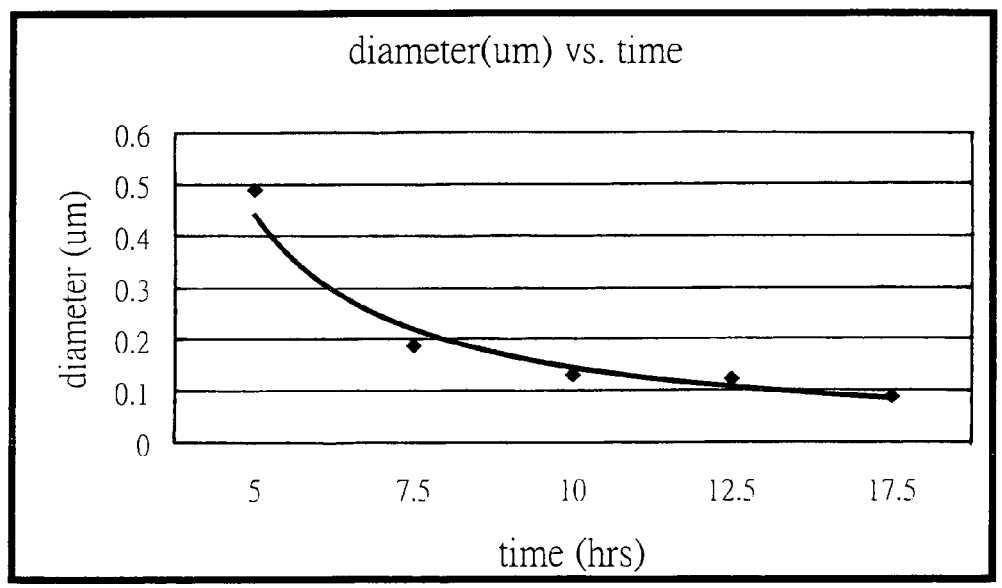
FIG. 5 is a table showing the relationship between the slurry mortaring time and the powder diameter in accordance with the present invention.
FIG. 5A is a graph (drawn by data of the HORIBA LA-920 diameter analyzer) showing the relationship between the slurry mortaring time and the powder diameter in accordance with the present invention.

First of all, in preparation of a slurry, the ceramic material of 137.87 g, the alcohol (EtOH) of 25.06 g, the toluene of 37.06 g, and the dispersant (such as byk-111) of 2.76 g (2.0% of the weight for the ceramic material) are prepared, wherein the viscosity is about 5 to 10 cp so as to assure the even dispersion. Then, the mixture is mortared and stirred by the mill balls (such as the $Zr_2O$ mill balls, wherein $\phi$=3 mm: 10 mm: 30 mm=5:3:2), thereby forming the sub-micrometer powder slurry. When the mixture is mortared and stirred by the mill balls, the $Zr_2O$ mill balls may adopt three different diameters (the powder diameter is about 0.09 to 0.30 $\mu$m), and the mixture is mortared at a lower rotation speed during 12 hours, thereby efficiently shortening the slurry mortaring time. FIGS. 5 and 5A show the relationship between the slurry mortaring time and the powder diameters.

Subsequently, in preparation of a binder, polyvinyl alcohol (PVA) of 0.4 g and water of 9.6 g are stirred evenly to form the binder (PVA=4%).

Subsequently, the sub-micrometer powder (the powder diameter is about 0.13 $\mu$m) slurry of 5 g is mixed with the binder of 5 g (PVA=4%), and the mixture is stirred violently and severely, thereby forming an emulsion gel.

Subsequently, the emulsion gel is dried into a solid, thereby forming the micro-pores structure of the present invention.

Subsequently, the palletizing process is performed. The above-mentioned bulk-shaped solid micro-pores structure is finely mortared into fine powder which is punched in a special fixture to form the heat dissipation layer having a predetermined shape.

Figures 4, 4A:
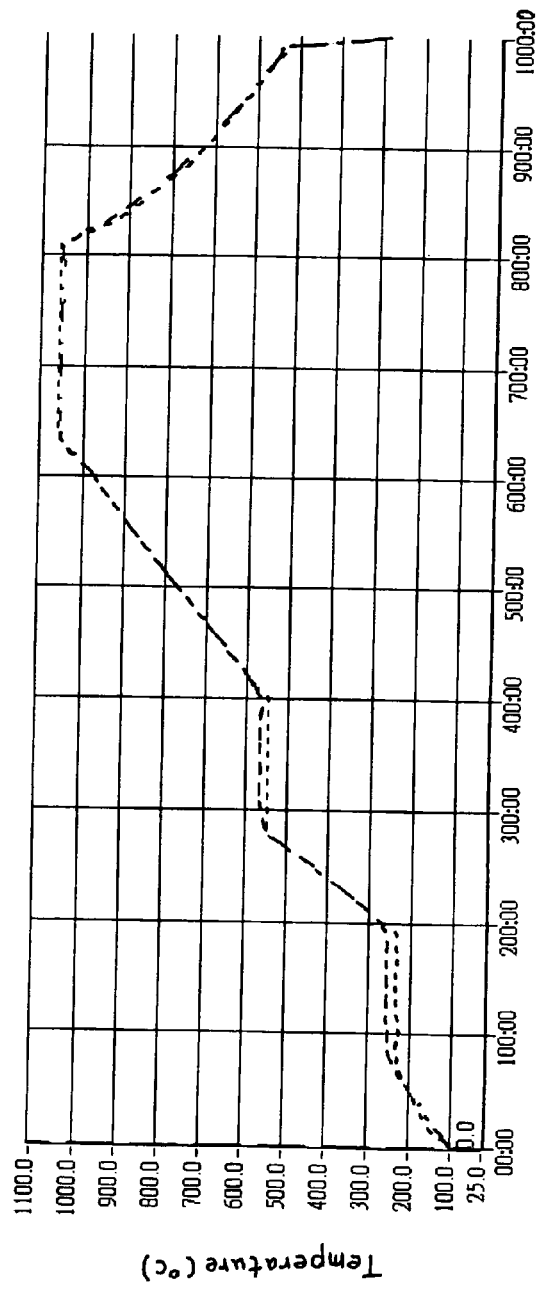
FIG. 4 is a table showing the increasing temperature setting in accordance with the present invention.
FIG. 4A is a graph (drawn by the THERMOTRACKER temperature monitor) showing the increasing temperature curve in accordance with the present invention.

Subsequently, the sintering process is performed. The heat dissipation layer having a predetermined shape is sintered to form a natural and even space in a three-stage increasing temperature manner, thereby forming the heat dissipation layer having a micro-pores structure with hollow crystals. FIGS. 4 and 4A show the setting of the increasing temperatures.

Finally, the printing process of the thermal conductive layer is performed. The thermal conductive layer is printed on the heat dissipation layer having a micro-pores structure with hollow crystals in a silver-printing manner, and is dried at the temperature of 150° C. during 2 minutes.

In test, the ceramic heat sink of the present invention made by the above-mentioned procedures is tested by the following method.

Figure 10:
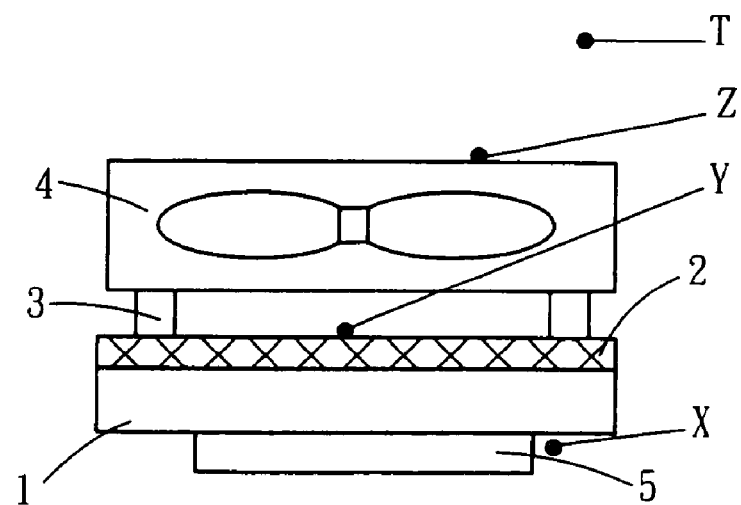
FIG. 10 is a plan cross-sectional assembly view of a testing module of the ceramic heat sink in accordance with the present invention.

As shown in FIG. 10, the testing module includes four temperature measuring points X, Y, T and Z, wherein T is the ambient temperature, Z is the temperature of the air inlet, X is the temperature of the CPU 5, and Y is the temperature of the heat dissipation layer 2. The heat source adopts the CPU of the Intel Pentium-4, 1.8 GHz, the cooling fan 4 adopts the Intel A65061-002, DC 12V, 0.16A, 4600 rpm, and the temperature recorder adopts the THERMO TRACKER, PRO-1000.

As shown in FIG. 16, the length/width of the material is 70×70 mm, and the cost of the material is calculated as follows. The price of aluminum is 87 NT dollars/Kg×the used weight, the price of copper is 98 NT dollars/Kg×the used weight, the price of MPC (the micro-pores ceramic) is 25 NT dollars/Kg×the used weight, and the price of epoxy is 100 NT dollars/Kg×the used weight. After comparison, the cost of material and the weight of the heat sink are much better than that of the conventional aluminum extruded heat sink.

As shown in FIGS. 12–15, in comparison, the aluminum has a smaller heat conducting coefficient, so that the Z-axis heat conducting capacity is interrupted by the ceramic micro-pores structure, thereby producing a greater temperature difference at the initial testing stage, so that the aluminum is not suitable for the starting stage.

Figure 11:
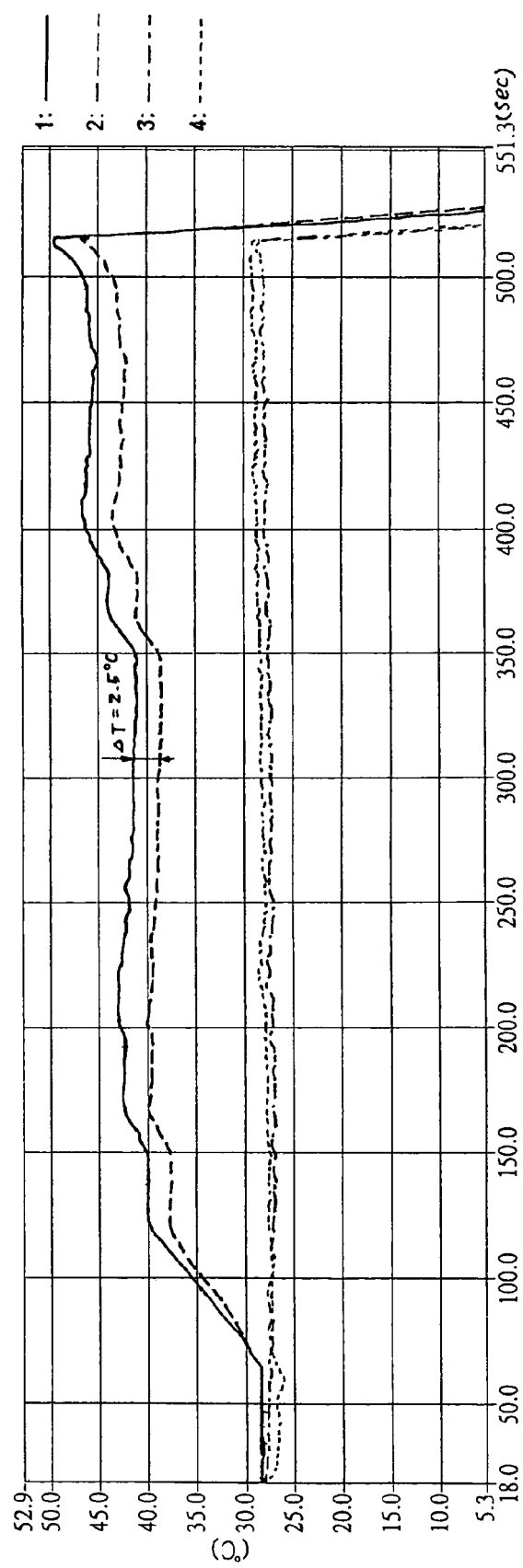
FIG. 11 is a graph (drawn by the THERMOTRACKER temperature monitor) showing the temperature curve of the heat sink (3 mm of copper and 1.8 mm of ceramic) that set on the 1.8 GHz CPU, in accordance with the present invention.
Figure 12:
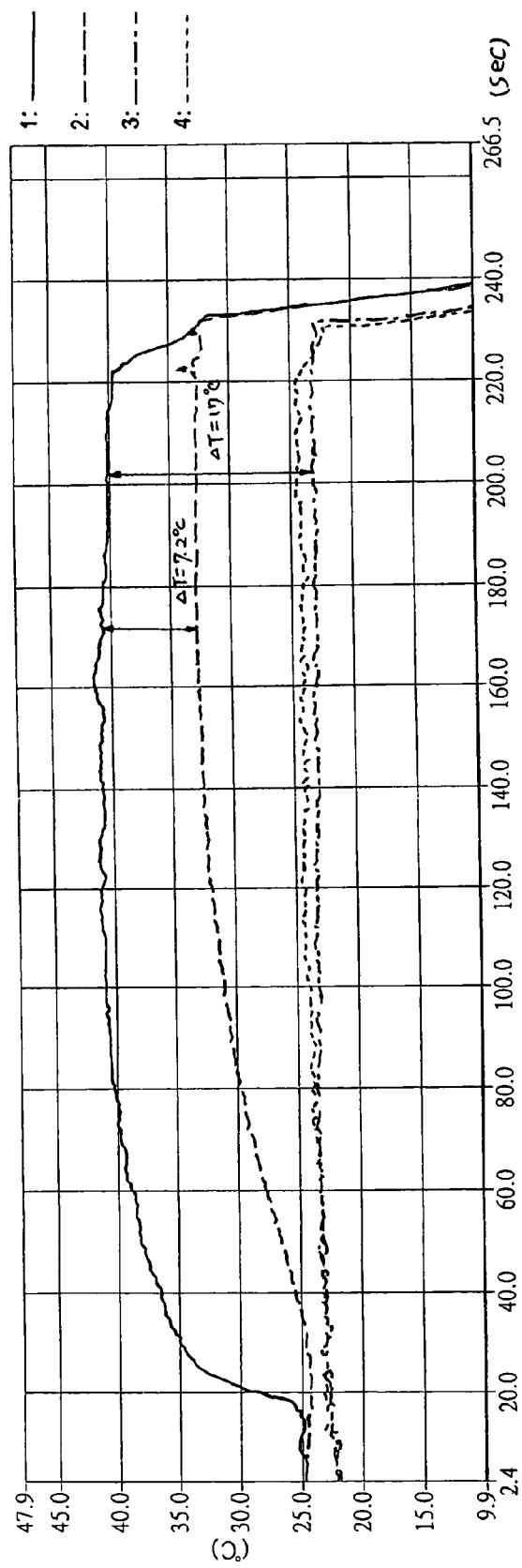
FIG. 12 is a graph (drawn by the THERMOTRACKER temperature monitor) showing the temperature curve of the heat sink (2.0 mm of copper and 1.8 mm of ceramic) in accordance with the present invention.
Figure 13:
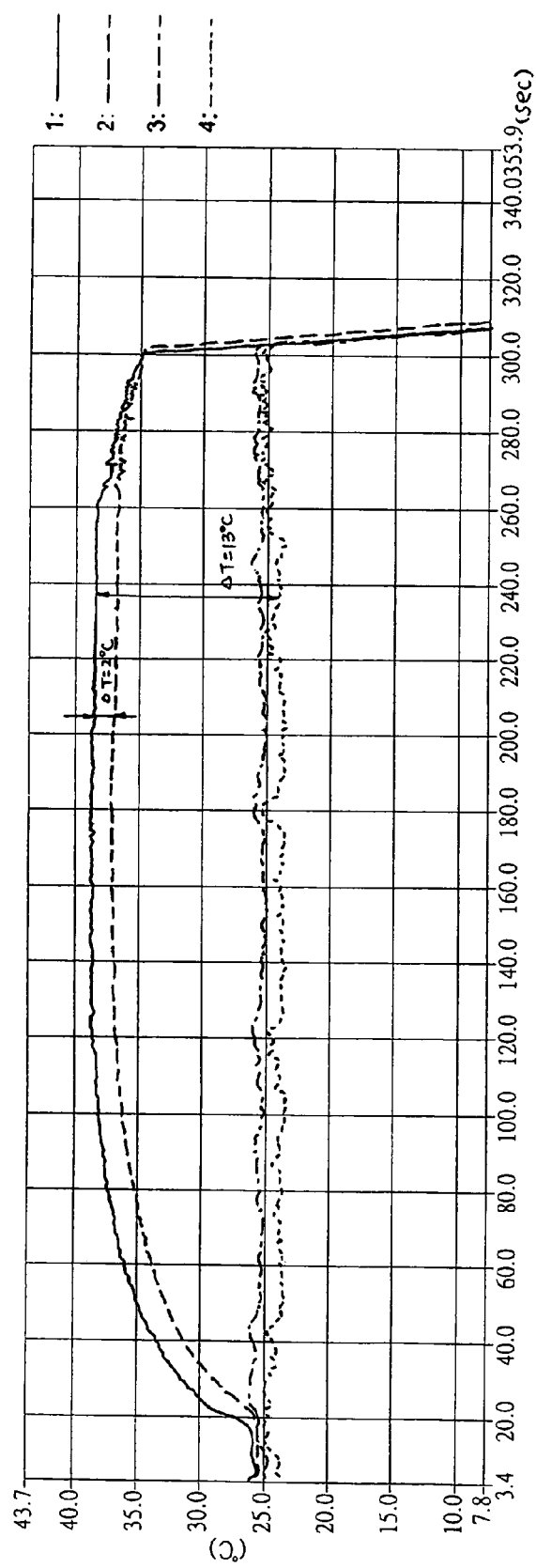
FIG. 13 is a graph (drawn by the THERMOTRACKER temperature monitor) showing the temperature curve of the heat sink (3.0 mm of copper and 1.8 mm of ceramic) in accordance with the present invention.
Figure 14:
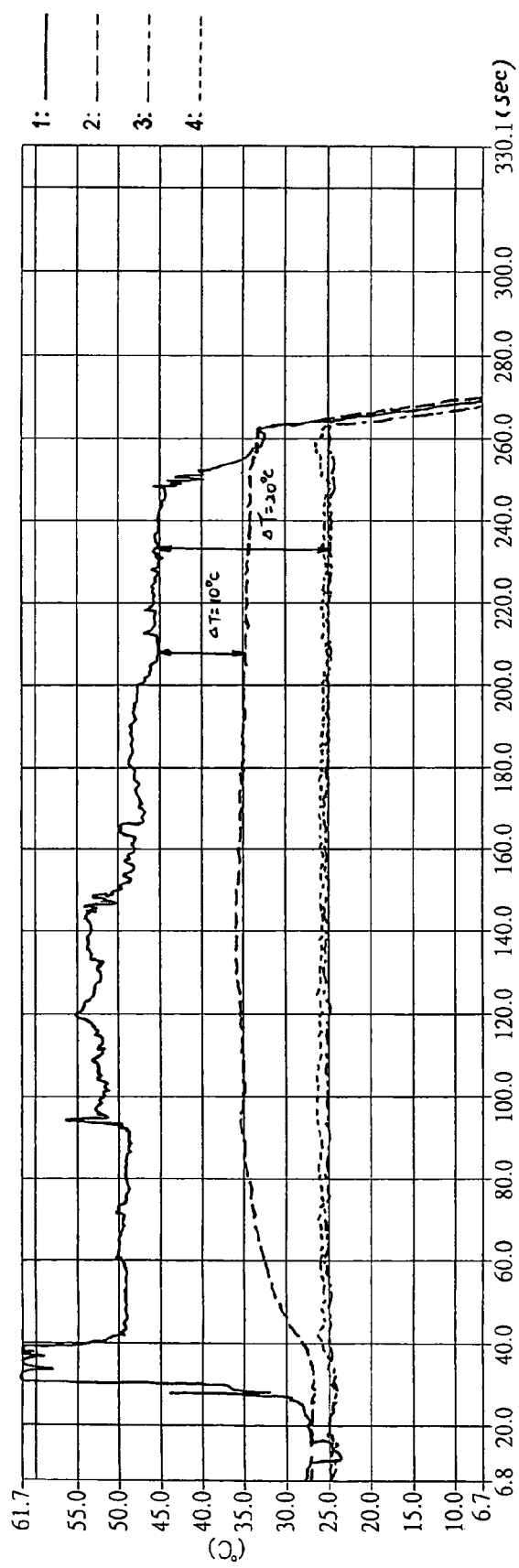
FIG. 14 is a graph (drawn by the THERMOTRACKER temperature monitor) showing the temperature curve of the heat sink (3.0 mm of aluminum, and 1.8 mm of ceramic) in accordance with the present invention.
Figure 15:
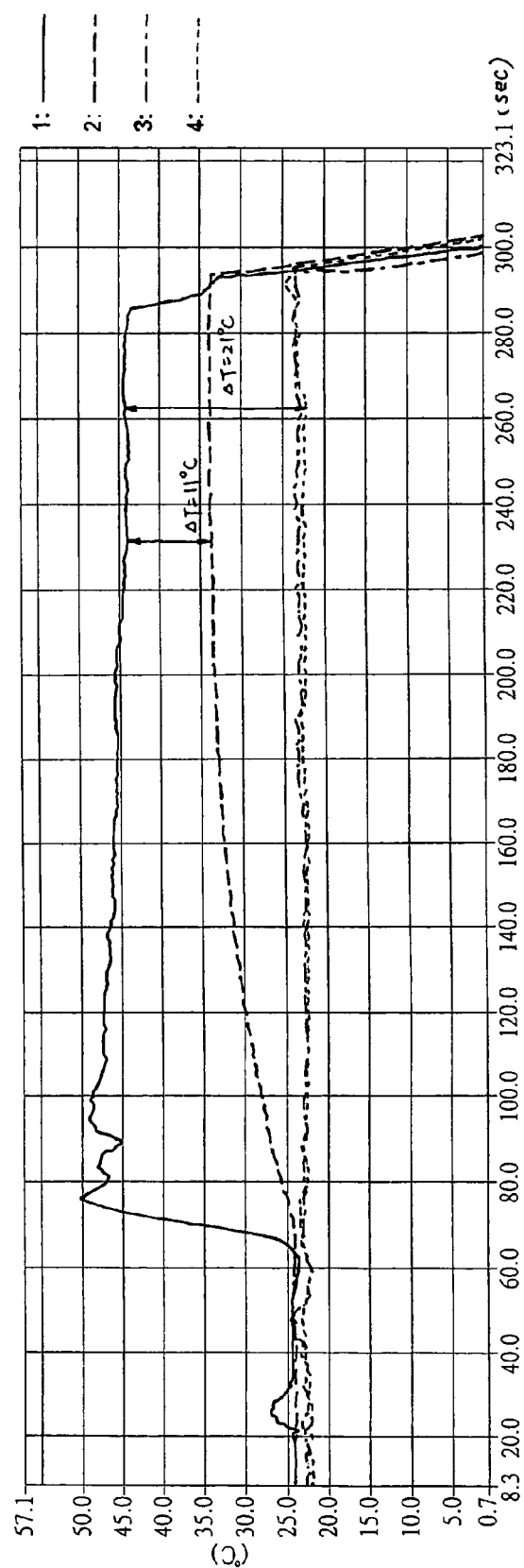
FIG. 15 is a graph (drawn by the THERMOTRACKER temperature monitor) showing the temperature curve of the heat sink (4.0 mm of aluminum and 1.8 mm of ceramic) in accordance with the present invention.
Figure 17:
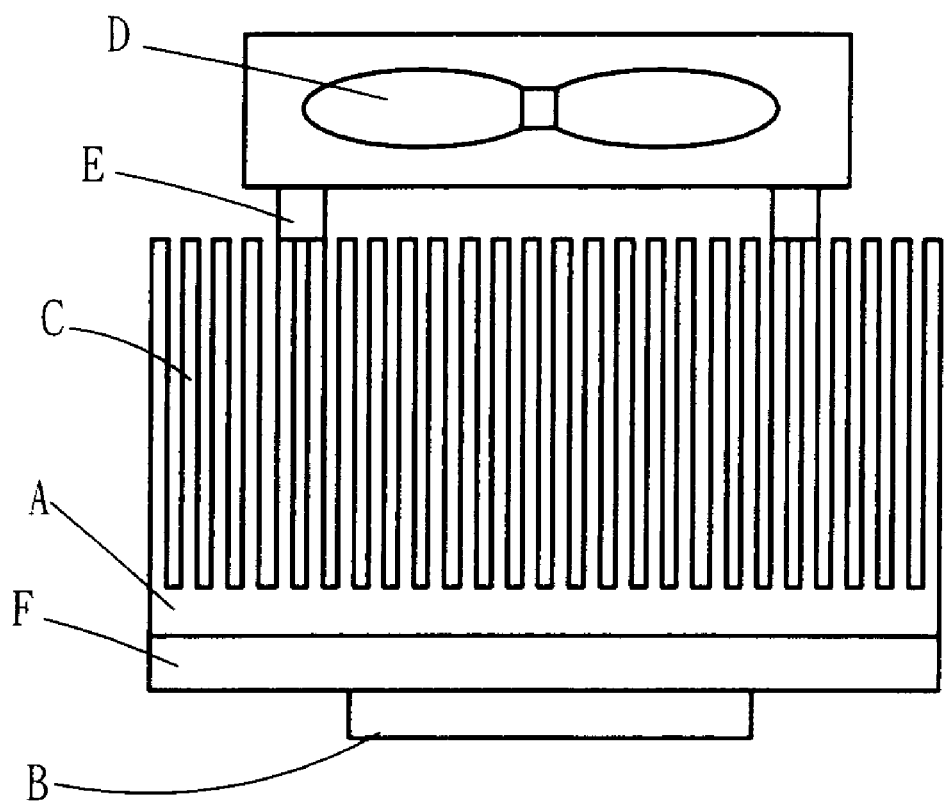
FIG. 17 is a plan view of a conventional heat sink in accordance with the prior art.

As shown in FIG. 11, the temperature increasing curve of the heat sink is shown, wherein the temperature at the measuring point X is only 43° C. at the starting stage, and only 47° C. during a period of time after operation, so that the heat dissipation efficiency is excellent.

Accordingly, the heat sink made of the micro-pores ceramic of the present invention has an enhanced heat dissipation effect, has a simplified production process, has material of a lower price, and has lower costs of fabrication.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A ceramic heat sink having a micro-pores structure, comprising:
   at least one thermal conductive layer mounted on a surface of a heat source to absorb heat from the heat source;
   a heat dissipation layer combined with the thermal conductive layer and having a micro-pores structure with hollow crystals to provide a relatively greater surface area; and
   a cooling fan mounted on the heat dissipation layer to provide a forced convection effect.

2. The ceramic heat sink having a micro-pores structure in accordance with claim 1, wherein the heat dissipation layer has a powder diameter about 0.09 to 0.30 $\mu$m.

3. The ceramic heat sink having a micro-pores structure in accordance with claim 1, wherein the heat dissipation layer has a porosity about 5% to 40%.

4. The ceramic heat sink having a micro-pores structure in accordance with claim 1, further comprising an epoxy layer sandwiched between the thermal conductive layer and the heat dissipation layer.

5. The ceramic heat sink having a micro-pores structure in accordance with claim 1, further comprising a snapping tool for combining the thermal conductive layer with the heat dissipation layer.

6. The ceramic heat sink having a micro-pores structure in accordance with claim 1, further comprising a snapping tool for snapping the cooling fan and for combining the thermal conductive layer with the heat dissipation layer.

* * * * *